United States Patent
Lelarge et al.

(12) 
(10) Patent No.: US 7,968,863 B2
(45) Date of Patent: Jun. 28, 2011

(54) OPTICAL DEVICE HAVING A QUANTUM-DOT STRUCTURE

(75) Inventors: François Lelarge, Marcoussis (FR); Benjamin Rousseau, Marcoussis (FR); Alain Accard, Palaiseau (FR); Frédéric Pommereau, Palaiseau (FR); Francis Poingt, Palaiseau (FR); Romain Brenot, Palaiseau (FR)

(73) Assignee: Alcatel Lucent, Paris (FR)

( * ) Notice: Subject to any disclaimer, the term of this patent is extended or adjusted under 35 U.S.C. 154(b) by 240 days.

(21) Appl. No.: 12/457,463

(22) Filed: Jun. 11, 2009

(65) Prior Publication Data
US 2009/0315019 A1 Dec. 24, 2009

(30) Foreign Application Priority Data
Jun. 19, 2008 (EP) .................................. 08305281

(51) Int. Cl.
*H01L 29/06* (2006.01)
(52) U.S. Cl. ...................... 257/9; 257/E31.033; 438/962
(58) Field of Classification Search ............... 257/9, 21, 257/E31.033; 438/962
See application file for complete search history.

(56) References Cited

U.S. PATENT DOCUMENTS

| 5,817,538 A | 10/1998 | Mukai et al. |
| 6,573,527 B1 | 6/2003 | Sugiyama et al. |
| 2007/0210300 A1 | 9/2007 | Kawaguchi |
| 2009/0315019 A1* | 12/2009 | Lelarge et al. ................. 257/25 |

OTHER PUBLICATIONS

Mikkelsen et al.: "Cross-sectional scanning tunneling microscopy studies of novel III-V semiconductor structures" Progress in Surface Science, Oxford, GB, vol. 80, No. 1-2, Jan. 1, 2005.
Levesque et al: "Self-organization of InAs/InP quantum dot multilayers: pseudophase diagram describing the transition from aligned to antialigned structures" Physical Review Letters American Physical Society USA, vol. 100, No. 4, Feb. 1, 2008.
Ouattara et al.: "Correlation Lengths in 1-18 stacked InAs quantum dot systems studied by cross-sectional scanning tunneling microscopy" Nanotechnology IOP Publishing UK, vol. 18, No. 14, Apr. 11, 2007.
European Search Report dated Nov. 26, 2008.

* cited by examiner

*Primary Examiner* — Mark Prenty
(74) *Attorney, Agent, or Firm* — Harness, Dickey & Pierce

(57) ABSTRACT

Method of manufacturing an optical device, and an optical device, the optical device having one or more layers (13) of quantum-dots located in-between barrier layers (12). A spacer layer (15) is grown on a barrier layer (12), such that the spacer layer (15) is adapted for substantially blocking strain fields induced by quantum-dot layers, thereby producing a smooth growth front for a subsequent barrier layer (12).

18 Claims, 1 Drawing Sheet

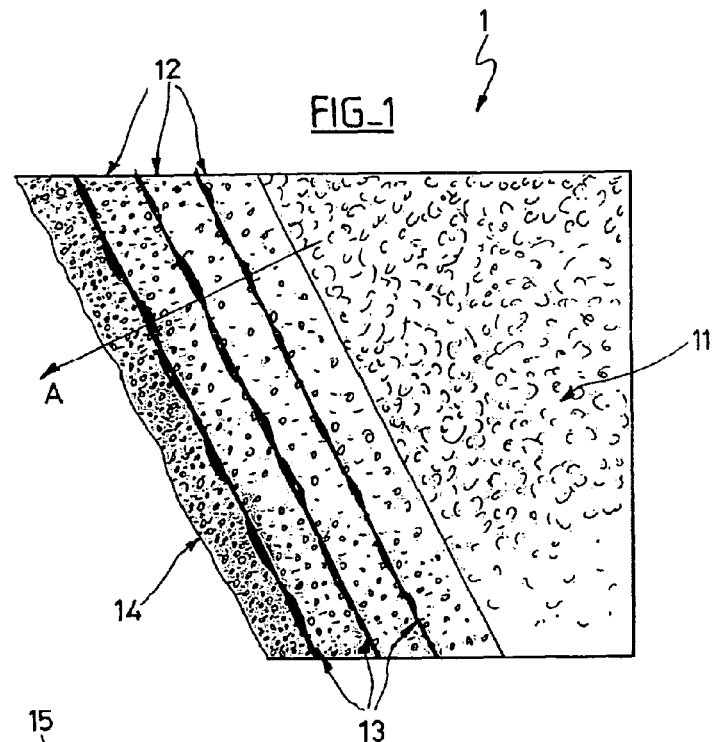
FIG_1
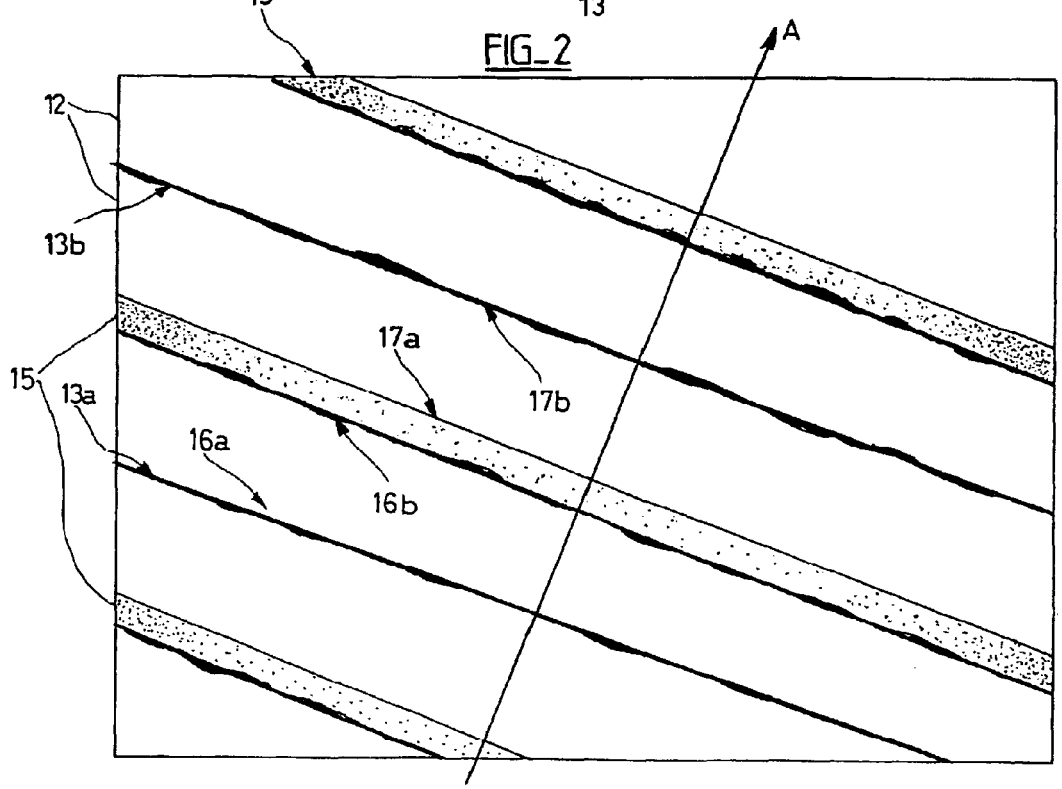
FIG_2

OPTICAL DEVICE HAVING A QUANTUM-DOT STRUCTURE

The present invention relates to the field of opto-electronics. In particular the invention relates to an optical device having a quantum-dot structure and optical signal processing units comprising such optical device.

BACKGROUND OF THE INVENTION

In order to obtain optical devices with improved performance, quantum-dot based devices using structures such as InAs/InGaAsP are becoming increasingly attractive. Typically, the substrate is made of InP and the active material is InAs Quantum dots embedded within an InGaAsP barrier. Examples of such devices are laser sources, optical amplifiers, optical sensors (detectors) or the like. The interest in using the quantum-dot based devices lies mainly in their ability to provide low chirp, low noise, low sensitivity to temperature and broad wavelength applications.

Quantum-well and quantum-dot semiconductor structures are well known in the related art. In brief terms, a quantum-well structure is arranged in such a way as to allow for propagation of electrons or holes in two spatial dimensions while limiting such propagation in a third dimension, whereas a quantum-dot structure is arranged in such a way so as to confine the carriers in three dimensions.

One advantage of using a quantum-dot structure for an optical device is that with such structures a relatively low timing-jitter in actively mode-locked lasers may be achieved.

However, quantum-dot based devices suffer from a relatively high sensitivity as regards polarization. This is a drawback because of the following reasons:

As it is known, an optical signal transmitted from an optical source, may be polarized. This means that the direction of oscillation of components of the optical signal is perpendicular to the direction of propagation of the optical signal itself. A well-known example of polarization is one having an electrical component and a magnetic component known as TE mode and TM mode respectively. The transmitted optical signal usually travels through an optical fiber towards an optical receiver. In practice, when a polarized optical signal travels along an optical fiber, it undergoes certain distortion as regards its polarization status. This is because the optical fibers are usually not capable of maintaining the modes of polarization in the original status as they are transmitted from the optical source. As a consequence, the optical signal is received at the receiver end with distorted polarization. Therefore, if the receiver is a polarization sensitive device, it will not be able to correctly process the received optical signal. As already mentioned above, quantum-dot based devices are polarization sensitive and therefore suffer from this drawback.

In order to overcome this problem, certain solutions are known. One of such solutions relates to cascading a bulk-based laser and a quantum-dot based laser. However, the cascading of the two devices results in structural complexities, increased size and cost and it may give rise to coupling losses.

Another solution relates to splitting the optical signal in order to change its polarization. In such cases, the input signal is split in order to separate the signal in two polarizations, TM and TE. The TM part is then rotated by a polarizer and recombined with the TE part before being sent in the SOA. However, this solution is not easy to implement because it would be required to avoid destructive interference between the two arms during the recombination process and furthermore it gives rise to substantial increase in packaging costs.

SUMMARY OF THE INVENTION

The present invention aims at overcoming, or substantially reducing the above drawbacks. The solution proposed by the present invention relates to the use, as a spacer, of a very thin layer of material that is not sensitive to the strain field induced by the previous quantum-dot layers on the stack. Such material may be a binary material such as for example InP or GaAS or GaP, however InP is preferred as it provides relatively better smoothing characteristics.

The growth front of the spacer layer is then efficiently smoothed before the deposition of the subsequent quantum-dot layer. In practice, the process of deposition of a binary spacer also gives rise to a smooth growth of its front during the deposition process itself.

This solution allows for closely stacking the quantum-dot layers without causing substantial inhomogeneous broadening and dislocations.

Advantageously, this additional InP layer may allow for an efficient coupling between quantum-dots by tunneling effect provided the InP layer is sufficiently thin. In practice, an InP layer with a thickness below 5 nm is considered to be sufficiently thin so as to allow for tunneling effect, while the thickness may be even as low as 1 nm. Within this range, some preferred values may be 2-3 nm, in view of the fact that the efficiency of the smoothening increases with the InP thickness. The InP layer (spacer) is therefore used to smoothen the surface and the carriers can tunnel through it in order to provide the required coupling between quantum-dot layers.

In some embodiments of the invention, there is provided a method of manufacturing an optical device having one or more quantum-dots layers and one or more barrier layers, the method comprising the step of growing on a barrier layer, a spacer layer adapted for substantially blocking a strain field induced by the quantum-dots layer.

In one embodiment, the spacer layer is grown with a growth front having a substantially smooth surface.

Preferably, a subsequent barrier layer is grown on the spacer layer, the subsequent barrier layer having a growth front with a substantially smooth surface.

Preferably a spacer layer of InP material is located between subsequent quantum-dot layers and in use, allows for a coupling between quantum-dot layers by tunneling effect.

In some embodiments of the invention, there is provided an optical device having one or more quantum-dots layers and one or more barrier layers of structure, the optical device further comprising a spacer layer on a barrier layer, the spacer layer being adapted for substantially blocking a strain field induced by the barrier layer.

Preferably, the optical device may have two or more quantum-dots layers and three or more barrier layers.

Preferably the spacer layer has a substantially smooth surface.

Preferably, a subsequent barrier layer is grown on a spacer layer, the subsequent barrier layer having a substantially smooth surface.

Preferably, the spacer layer is made of a binary material.

Preferably, the binary material is InP.

Preferably the spacer layer has a thickness of about 3 nm.

Preferably, a separation between two subsequent quantum-dot layers is of about 5 nm.

Preferably a spacer layer of InP material is located between subsequent quantum-dot layers being adapted to allow for a coupling between quantum-dot layers by tunneling effect.

These and further features and advantages of the present invention are described in more detail in the following description as well as in the claims with the aid of the accompanying drawings.

BRIEF DESCRIPTION OF THE DRAWINGS

FIG. 1 is a graphical representation of a microscopic image of an optical device having a stack of 3 quantum-dot layers and structured according to conventional methods.

FIG. 2 is a graphical representation of a microscopic image of an optical device structured according to the present invention.

EXAMPLES OF PREFERRED EMBODIMENTS

As stated further above, it is desired to provide quantum-dot based devices which are polarization insensitive, or at least demonstrate substantially low polarization sensitivity. Such devices may typically provide improved time jitter characteristics.

According to theatrical considerations, it is believed that polarization sensitivity may be reduced if quantum-dot layers are stacked very closely to each other thereby facilitating a strong electronic coupling between the stacked quantum-dots.

However experimental attempts have proved it to be technically very difficult to stack a large number of quantum-dot layers with very thin spacers without degrading tremendously the performance of the device. The interest in stacking a large number of quantum-dot layers is directed to obtaining an acceptable level of gain. By stacking a large number of quantum-dot layers, the polarization insensitivity may become more predictable, however this will require a relatively large stack of layers, for example about 10, with very thin spacers. Another condition to obtain an acceptable level of gain is the use of layers having a relatively good quality.

In practice, one difficulty would reside in reducing the separation between adjacent quantum-dot layers to desired levels. According to current reports, in 1.55 μm quantum-dot based devices, spacers of a thickness of about 10 nm with only 4 quantum-dot layers have been obtained. This seems to have been as thin of a spacing as possibly obtainable for a device capable of operating properly. A thinner spacing has been known to give rise to the generation strain fields induced between adjacent quantum-dot layers.

In the present description, a large stack of quantum-dot layers may include 9 or more layers and a thin spacer layer may be about 3 nm.

FIG. 1 shows a graphical representation of an image of a portion of a conventional optical device 1, the image having been taken by means of a Transmission Electron Microscope (TEM). The optical device 1, has an n-cladding part 11 which is typically made InP. The optical device 1 is shown to have a number of barrier and confinement layers 12 made for example of GaInAsP or AlGaInAs which have been grown on the substrate 11. The direction of growth is shown by means of arrow A. Quantum-dot layers 13 are provided between respective barrier layers 12. As it can be clearly seen from the figure, the respective surfaces of the quantum-dot layers 13 as well as those of the barrier layers 12 are rough (not smooth). Furthermore, the roughness of the shape of the surfaces increases as one moves from the lower quantum-dot layers to the upper quantum-dot layers (in the direction of the arrow A). In the figure, it may be observed that the upper surface 14 of the device presents a higher level of roughness as compared to the lower surface of the of the substrate 11. This is mainly due to the fact that during the growth process of the layers, the upper interfaces, or surfaces, of quantum-dot layers 13 (which are rough) have not been smoothed during the deposition of the barriers layers 12. The roughness is generally due to the high sensitivity of the barrier material, for example GaInAsP, to the strain field induced by the previous quantum-dot layers during growth. As a consequence of the increased roughness, the thickness of the quantum-dot layers 13 also increases from a lower quantum-dot layer to an upper quantum-dot layer as can be observed in FIG. 1 in the direction of the arrow A. Therefore the strain fields are not blocked and their effects increases as the number of the stacks increases. As already mentioned above, strain fields are detrimental when a closely stacked structure is desired.

FIG. 2 shows a graphical representation of an image of a portion of an optical device according to an embodiment of the invention. The image itself was taken by means of a Transmission Electron Microscope (TEM). It is to be noted that this image is only represented in an exemplary manner and it is not to be construed as limiting the scope of the present invention.

In FIG. 2, there is shown a stack of quantum-dot layers, 13a and 13b, located between respective barrier layers 12 and the direction of growth is shown by arrow A.

According to the invention, spacer layers 15 are deposited on respective barrier layers 12. The spacer layers are of material which is insensitive to strain fields, or at least is capable of substantially blocking the effect of a strain field as it is deposited on a rough surface of the barrier layer 12. As mentioned further above, binary materials, such as InP, are examples of material usable for this purpose. It is to be noted that in real practice, the material used as a spacer may not be absolutely insensitive to strain field as ideal conditions may not be obtainable with real-life material. Therefore, in the present description, reference to a material which is "insensitive" to strain fields is to be understood in relative terms as being a material which is capable of substantially blocking the effect of a strain field.

As shown in FIG. 2, the quantum-dot layer 13a presents a rough surface 16a. A barrier layer 12 is deposited over the quantum-dot layer 13a which due to the roughness of the latter, forms a rough surface 16b when the deposition is finalized. Next the spacer layer 15 is deposited over the surface 16b of the barrier layer 12. As the spacer layer 15 is insensitive to strain fields, the resulting surface 17a of the spacer 15 is substantially smooth (free from roughness). The subsequent barrier layer, barrier 12, is therefore grown on this smooth surface 17a. As a consequence, strain fields are avoided and a smooth upper surface 17b for the barrier layer 12 is obtained.

Therefore, as the intermediate spacer layer 15 has a smooth surface on the growth front, it allows for growing thereupon relatively thin barrier layers 12, and thereby a relatively significant number of quantum-dot layers may be stacked. Experiments have shown that even a stack of up to 20 quantum-dot layers does not induce any substantial dislocations in the device structure.

In a practical experimentation, a sample device was made having a stack of 10 quantum-dot layers with a spacer layer thickness of 3 nm being of InP material which was placed between two barriers each having a thickness of 1 nm. The device was processed using a single transverse mode laser technology. The result showed a threshold current $I_{Th}$ of about 50 mA and external efficiency of about 0.1 W/A per facet (W/A per facet being the efficiency of the device indicating a threshold of output power in Watts relative to the current, in Amperes, that is injected in the device). The experiment therefore showed success in achieving a close stacking of about 5 nm separation—namely 3 nm of spacer layer thickness plus 2 nm corresponding to two barriers on either side of the spacer layer, each having a thickness of 1 nm-of 10 quantum-dot layers without introducing non-radiative defects.

The solution proposed by the present invention provides the important advantage of making possible the manufacture of optical devices with closely stacked quantum-dot layers without degrading the material quality of the stack. As a consequence, the potential quantum-dot based devices, with the associated advantages of presenting low timing-jitter, large optical bandwidth, become compatible with polarization insensitive operation. By providing such devices, it becomes possible to take advantage of other potential useful characteristics of these devices, as stated above, for applications in optical fiber communications.

With the solution proposed by the present invention, wideband semiconductor optical amplifiers (SOA) with high-temperature behavior can be manufactured having improved characteristics. A further advantage is that low chirp amplification may become achievable.

The device of the present invention may be used in any unit for performing optical signal processing such as but not limited to clock recovery, optical amplification, wavelength conversion or signal treatment.

Further it is to be noted that the list of structures corresponding to the claimed means is not exhaustive and that one skilled in the art understands that equivalent structures can be substituted for the recited structure without departing from the scope of the invention.

The invention claimed is:

1. Method of manufacturing an optical device having one or more quantum-dots layers and one or more barrier layers, the method comprising the step of growing on a barrier layer, a spacer layer adapted for substantially blocking a strain field induced by the barrier layer.

2. The method of claim 1 wherein the spacer layer is grown with a growth front having a substantially smooth surface.

3. The method of claim 1 wherein the a subsequent barrier layer is grown on the spacer layer, the subsequent barrier layer having a growth front with smooth surface.

4. The method of claim 1, wherein a spacer layer of InP material is located between subsequent quantum-dot layers, and in use, allows for a coupling between quantum-dot layers by tunneling effect.

5. An optical device having one or more quantum-dots layers and one or more barrier layers, the optical device further comprising a spacer layer on a barrier layer, the spacer layer being adapted for substantially blocking a strain field induced by a barrier layer.

6. The optical device of claim 5 wherein the optical device may have two or more quantum-dots layers and three or more barrier layers.

7. The optical device of claim 5 wherein the spacer layer has a substantially smooth surface.

8. The optical device of claim 5 wherein a subsequent barrier layer is grown on the spacer layer, the subsequent barrier layer having a substantially smooth surface.

9. The optical device of claim 5, wherein the spacer layer is made of a binary material.

10. The optical device according to claim 9 wherein the binary material is InP.

11. The optical device according to claim 5 wherein the spacer layer has a thickness of about 3 nm.

12. The optical device according to claim 5 wherein a separation between two subsequent quantum-dot layers is of about 5 nm.

13. The optical device according to claim 5 wherein a spacer layer of InP material is located between subsequent quantum-dot layers being adapted to allow for a coupling between quantum-dot layers by tunneling effect.

14. A unit for performing optical signal processing comprising the optical device of claim 5.

15. The unit of claim 14, being a clock recovery unit

16. The unit of claim 14, being a optical amplification unit.

17. The unit of claim 14, being a wavelength conversion unit.

18. The unit of claim 14, being a signal treatment unit.

* * * * *